United States Patent [19]

Morgan et al.

[11] Patent Number: 5,923,592
[45] Date of Patent: *Jul. 13, 1999

[54] FAST, LOW POWER, WRITE SCHEME FOR MEMORY CIRCUITS USING PULSED OFF ISOLATION DEVICE

[75] Inventors: Donald M. Morgan; Loren L. McLaury, both of Boise, Id.

[73] Assignee: Micron Technology, Inc., Boise, Id.

[*] Notice: This patent is subject to a terminal disclaimer.

[21] Appl. No.: 09/080,548

[22] Filed: May 18, 1998

Related U.S. Application Data

[63] Continuation of application No. 08/515,864, Aug. 16, 1995, Pat. No. 5,754,478, which is a continuation-in-part of application No. 08/246,443, May 20, 1994, Pat. No. 5,506,811, which is a continuation of application No. 08/049,275, Apr. 20, 1993, Pat. No. 5,369,622.

[51] Int. Cl.$^6$ ..................................................... G11C 7/00
[52] U.S. Cl. .................... 365/189.01; 365/149; 365/207; 365/190
[58] Field of Search ............................. 365/189.01, 149, 365/207, 190

[56] References Cited

U.S. PATENT DOCUMENTS

| | | |
|---|---|---|
| 4,636,987 | 1/1987 | Norwood et al. . |
| 4,748,349 | 5/1988 | McAlexander, III et al. . |
| 4,916,667 | 4/1990 | Miyabayashi et al. . |
| 5,014,245 | 5/1991 | Muroka et al. . |
| 5,029,137 | 7/1991 | Hoshi . |
| 5,053,997 | 10/1991 | Miyamato et al. . |
| 5,138,578 | 8/1992 | Fujii . |
| 5,193,075 | 3/1993 | Hatano et al. . |
| 5,227,697 | 7/1993 | Sakagami . |
| 5,235,547 | 8/1993 | Kobayashi . |
| 5,255,243 | 10/1993 | Kitazawa . |
| 5,258,950 | 11/1993 | Murashima et al. ............... 365/189.05 |
| 5,265,025 | 11/1993 | McLaury . |
| 5,369,620 | 11/1994 | Sugibayashi ................... 365/189.01 X |
| 5,369,622 | 11/1994 | McLaury . |
| 5,418,753 | 5/1995 | Seki ....................................... 365/207 |
| 5,506,811 | 4/1996 | McLaury . |

*Primary Examiner*—Huan Hoang
*Attorney, Agent, or Firm*—Kirkpatrick & Lockhart LLP

[57] ABSTRACT

A circuit, for controlling a write operation during which data from data lines is written to a memory cell, is used with a memory cell of the type that is connected to a row line and a first column line. An amplifier is connected across the first column line and a column line complimentary to the first column line. The column lines have a capacitance associated therewith. The circuit includes a control circuit for generating switching control signals. Switches are provided which are positioned in the column lines and are responsive to the switching control signals for selectively isolating at least a portion of the column lines during a predetermined portion of the write operation.

22 Claims, 15 Drawing Sheets

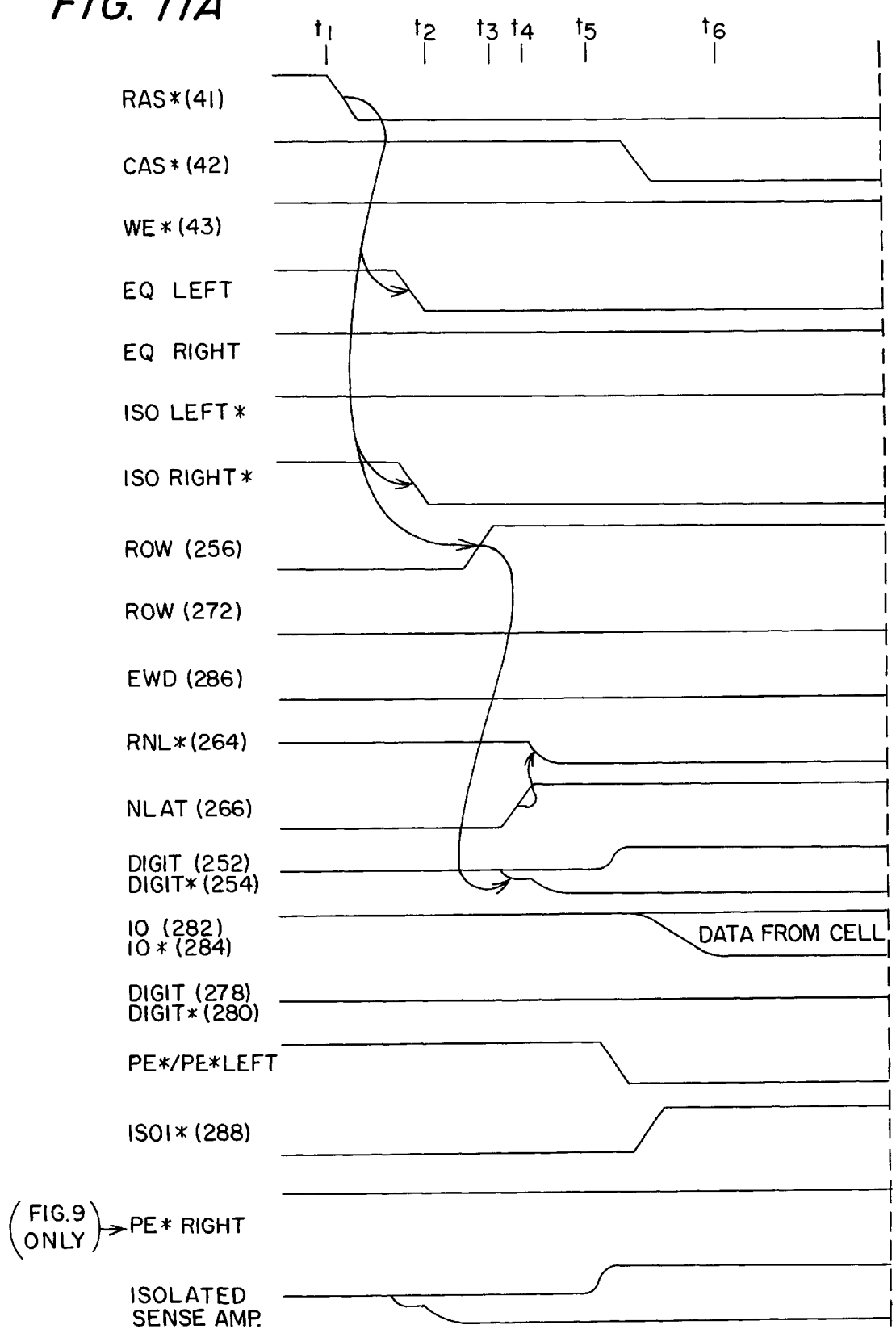
FIG. 11A  READ-MODIFY-WRITE CYCLE

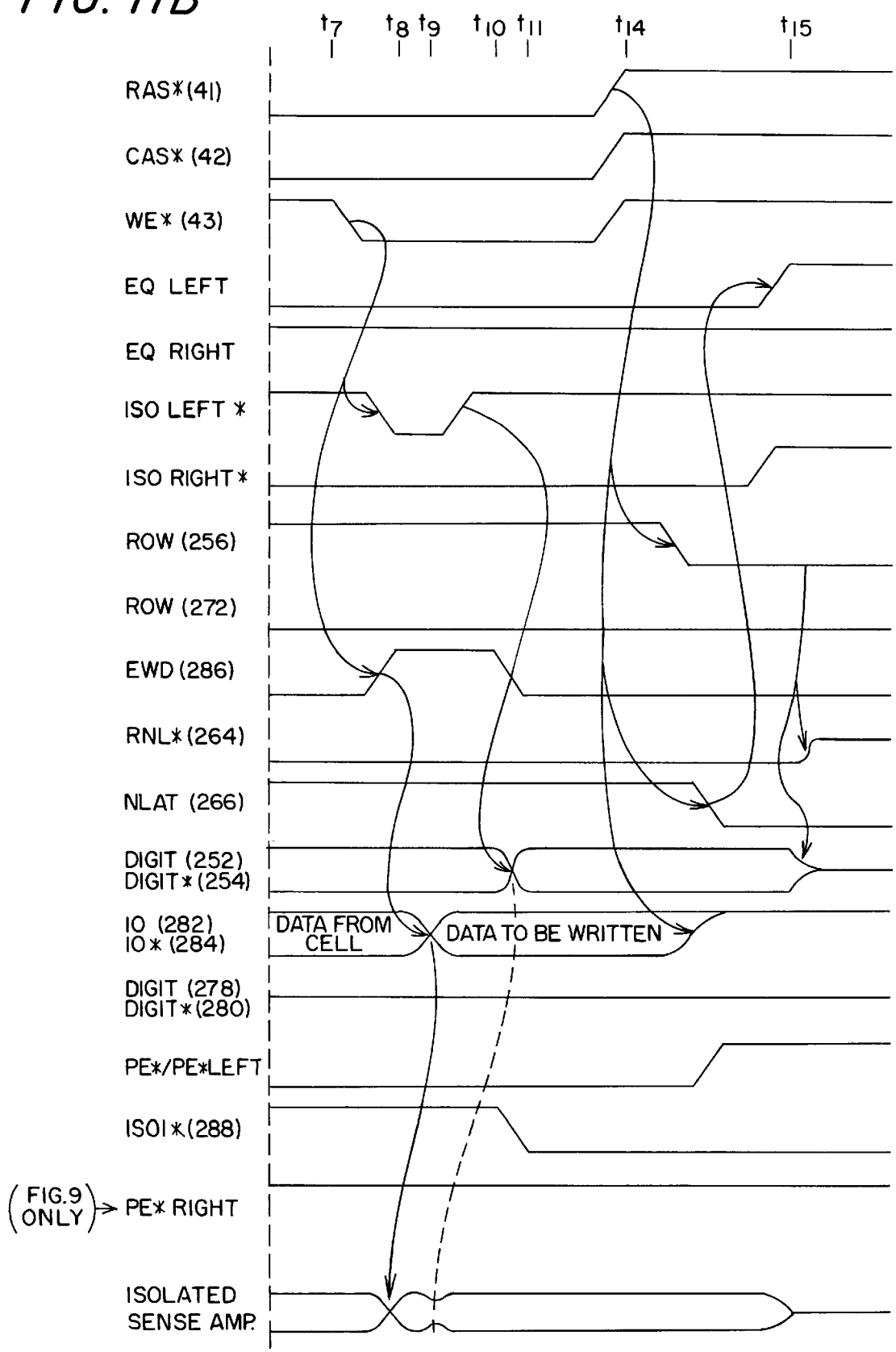
FIG. 11B  READ-MODIFY-WRITE CYCLE

FAST, LOW POWER, WRITE SCHEME FOR MEMORY CIRCUITS USING PULSED OFF ISOLATION DEVICE

CROSS-REFERENCE TO RELATED APPLICATIONS

This application is a continuation of U.S. patent application Ser. No. 08/515,864, filed Aug. 16, 1995, now U.S. Pat. No. 5,754,478, which is a continuation-in-part of application Ser. No. 08/246,443, now U.S. Pat. No. 5,506,811, issued Apr. 9, 1996, filed May 20, 1994 which is a continuation of application Ser. No. 08/049,275, now U.S. Pat. No. 5,369,622, issued Nov. 29, 1994 filed Apr. 20, 1993.

BACKGROUND OF THE INVENTION

1. Field of the Invention

The present invention is directed generally to integrated circuit memory devices and more particularly to a circuit architecture and control scheme for writing to such devices.

2. Description of the Background

Integrated circuit memories generally contain a two dimensional array of storage cells arranged in rows and columns. A common architecture connects all cells in a row to a common row line, often referred to as the "word line" and all cells in a column to a common column line often called the "digit line".

Cells in the array are identified by a binary row address and a binary column address. A row decoder responds to the binary row address and activates one row line for read or write access. A column decoder responds to the binary column address and activates read or write circuitry associated with one column, conventionally, a sense amplifier connected across a pair of complementary digit lines.

Integrated circuit memories are also generally binary logic circuits in which information is stored and transferred as logic states (conventionally, voltages) representing complementary logic values that are alternately referred to as "on" and "off", "true" and "false", "logic 1" and "logic 0", or logic "high" and logic "low". A voltage of 5 volts may represent the logic 1 state while a voltage of zero volts may represent the logic 0 state. Because of the constraints of resistance, capacitance, etc., the individual cells are usually at an intermediate voltage. Thus, subcircuits are associated with the digit lines of integrated circuit memories to pull the intermediate logic 1 voltage up to, or in excess of the full logic 1 voltage, for example, 5 volts. Other subcircuits pull the intermediate logic 0 down to, or below the-logic 0 voltage, for example 0 volts. A common architecture employs a P-sense amplifier for the pull up subcircuit and an N-sense amplifier as the pull down subcircuit.

The present invention is particularly applicable to a conventional architecture used in dynamic random access memories (DRAM) and video random access memories (VRAM). In the conventional architecture each memory cell comprises a transistor and a capacitor connected in series. One side of the capacitor is connected to a reference voltage, and the other side is connected to the digit line through the transistor. The gate of the transistor is connected to the row line. Information is stored in the form of charge on the capacitor, which charge is input and output via the digit line and gated by the row line acting on the transistor gate. Often a large number of such cells are connected to each digit line. The digit lines are organized in pairs with an N-sense amplifier and a P-sense amplifier associated with each pair. The N-sense amplifier and the P-sense amplifier are each connected across a pair.

A sense amplifier is a bistable circuit having two complementary signal nodes (sense nodes) used for both input and output. In a read access, an addressed cell is gated onto the first digit line and no cells are gated onto the second digit line. The sense amplifier will then attain the bistable state corresponding to the charge of the addressed cell. The first and second digit lines will be driven by the sense amplifier to complementary states. In a write access, a data signal and its complement are gated onto a pair of digit lines with sufficient energy to overcome the sense amplifier's response to the addressed cell. The sense amplifier, after attaining the state corresponding to the data signal, will cause the addressed cell to be appropriately charged. When the read or write cycle is over, the pairs are shorted together (equilibrated), which quickly brings them to a mid voltage level, resetting them for the next cycle.

A common arrangement of the various parts of the circuit described above locates the column decoder and DRAM input/output terminals at one end of the digit lines and the N-sense amplifiers at the center of the digit lines, thereby dividing each of the digit lines into two halves. One half of a digit line extends from the N-sense amplifier to the column decoder. The other half extends from the N-sense amplifier to the P-sense amplifier. In a conventional VRAM architecture the second half continues beyond the P-sense amplifier and connects to a sequential-access memory (SAM) port.

As is well-known, integrated circuit memories are generally mass produced by fabricating hundreds of identical circuit patterns on a single semiconducting wafer. Each wafer is subsequently cut into hundreds of identical dies or chips. The advantages of building integrated circuits with smaller individual circuit elements are well known: more and more circuitry may be fabricated on a single chip, electronic equipment may become less bulky, reliability is improved by reducing the number of solder or plug connections, assembly and packaging costs are minimized, circuit performance may improve and higher clock speeds become feasible. For integrated circuit memories there are some disadvantages. As the size of the individual cell is reduced, the size of the individual electrical components in the cell and the strength of the electrical signals associated with them is also reduced. As the number of individual storage cells on a single chip is increased, the length of the digit lines connecting cells to sense amplifiers becomes longer. The capacitance associated with each digit line becomes large in comparison to the capacitance of a memory cell. Hence, the signal transferred to the digit line from an individual storage cell becomes weaker and the time for developing a useful signal level on a digit line will increase. As is well known, speed is an important factor in such memories. The faster the cells can be written, the faster the associated computer circuit of which the memory may be a part can operate, and the more functions the computer can adequately perform.

Another problem that flows from shrinking circuit size is that not all circuits scale down the same. Specifically, an array of memory cells may shrink more than the required sense amps and other support circuits. When the support circuits no longer fit into the pitch of the memory array, special techniques must be employed to maintain the desired level of operability.

A number of enhancements have been made to DRAM and VRAM architecture to increase the signal level and sense amplifier response time. Several such enhancements are described in U.S. Pat. Nos. 4,748,349, 4,636,987, and 5,265,050. The first patent describes a circuit which boosts the voltage on the row line and, thus, the gate of the gating transistors to a value above the high logic voltage of the circuit. Boosting permits the full high logic voltage to be placed on the cell capacitor, because the threshold voltage drop across the gating transistor is eliminated. The second patent describes an architecture in which an N-sense amplifier is connected to a pair of digit lines at the mid point. Each half digit line connects to the N-sense amplifier through an isolation transistor. The isolation transistors respond to a timing signal to isolate the N-sense amplifier from one half of the digit line pair during a read cycle. For example, when the row being addressed is on the left half of the digit line pair, the isolating transistors between the N-sense amplifier and the left half of the digit line pair are on while the isolating transistors between the N-sense amplifier and the right half are off. Thus, the N-sense amplifier is connected to only one half of the full digit line during the read cycle. During a write cycle the P-sense amplifier is turned off and input data signals are driven from the I/O lines onto the full length of the digit lines. The third patent describes an isolation technique for faster read cycles. The method of writing data to a cell includes turning off the P-sense amplifier and driving input data from the I/O lines onto the full length of the digit lines.

There remains a need for a memory architecture that allows fast write cycles. A solution which also decreases power dissipation would be desirable. For many applications of integrated circuit memories, such as for portable computers and other battery powered intelligent devices, the amount of power available is limited. It is important in such applications that sense amplifiers not only are fast and small, but also consume a minimum of power. In the conventional technologies, the largest component of the total power used in a DRAM is used to charge and discharge digit lines.

SUMMARY OF THE INVENTION

The present invention is directed to a circuit for controlling a write operation during which data from data lines is written to a memory cell. The memory cell is of the type which is connected to a row line and a first column line. An amplifier is connected across the first column line and a column line complementary to the first column line. The column lines have a certain capacitance associated therewith. The circuit of the present invention comprises a control circuit for generating switching control signals and a plurality of switches. The positioning of the switches may vary depending upon the circuit architecture of the memory array of which the cell is a part. However, in all cases, there are at least two switches positioned in the column lines which are responsive to the switching control signals for selectively isolating at least a portion of the column lines during a predetermined portion of the write operation. By isolating a portion of the column line, the capacitance associated with that portion of the column lines is not seen by the write drivers during that portion of the write operation.

According to a particular embodiment of the invention, a memory device is responsive to a data signal on data lines. The memory device comprises first and second column lines. A sense amplifier is connected across the first and second column lines. A memory cell, which may be a dynamic memory cell, is connected to one of the first and second column lines. An isolation switch is connected between the memory cell and the sense amplifier. Switches are also provided for selectively connecting the column lines to the data lines. A control circuit generates switching signals for selectively isolating the cell from the sense amplifier while the sense amplifier is connected to and receives data from the data lines. Thereafter, switching signals are generated for connecting the sense amplifier to the memory cell to write the data signal to the memory cell. In that manner, the data on the data line is written to the sense amplifier while the capacitance associated with the column lines is isolated from the sense amplifier. When the sense amplifier is connected to the cell, it may be desirable to maintain the connection between the sense amplifier and the data line for some or all of the necessary write time.

The write schemes of the present invention, by pulsing the various switches off and on at appropriate times, eliminates much, if not all, of the capacitance associated with the column lines while the sense amplifier assumes the state of the data to be written. Thereafter, the data can be written to the cell from the sense amplifier with, or without, the help of the write drivers. By isolating the capacitance of the column lines for at least a portion of the write operation, the time necessary and the power required to perform the write operation are reduced. Those and other aspects, advantages, functions and results of the present invention will become apparent to those skilled in the art by reference to the following description of the invention in conjunction with the accompanying figures.

BRIEF DESCRIPTION OF THE DRAWINGS

For the present invention to be clearly understood and readily practiced, the present invention will be described in conjunction with the following figures wherein:

FIG. 11a and FIG. 11b present a timing diagram describing a read-write method of controlling sense amplifiers and input buffers shown in FIGS. 6, 8 and 9;

In the functional block diagrams, a broad arrow symbolically represents a group of signals that together signify a binary code. A group of address lines is represented by a broad arrow because a binary address is signified by the signals taken together at an instant in time. A group of signals having no binary coded relationship is shown as a single line with an arrow. A single line between functional blocks represents one or more control signals. Signals that appear on several of the Figures and have the same mnemonic are directly or indirectly coupled together. A signal named with a mnemonic and a second signal named with the same mnemonic followed by an asterisk are related by logic inversion.

In each timing diagram the vertical axis represents binary logic levels and the horizontal axis represents time. Neither axis is drawn to scale. The vertical axis is intended to show the transition from active (asserted) to passive (nonasserted,) states of each logic signal. The voltage levels corresponding to the logic states of the various signals are not necessarily identical among the various signals.

DESCRIPTION OF THE PREFERRED EMBODIMENTS

Figure 1:
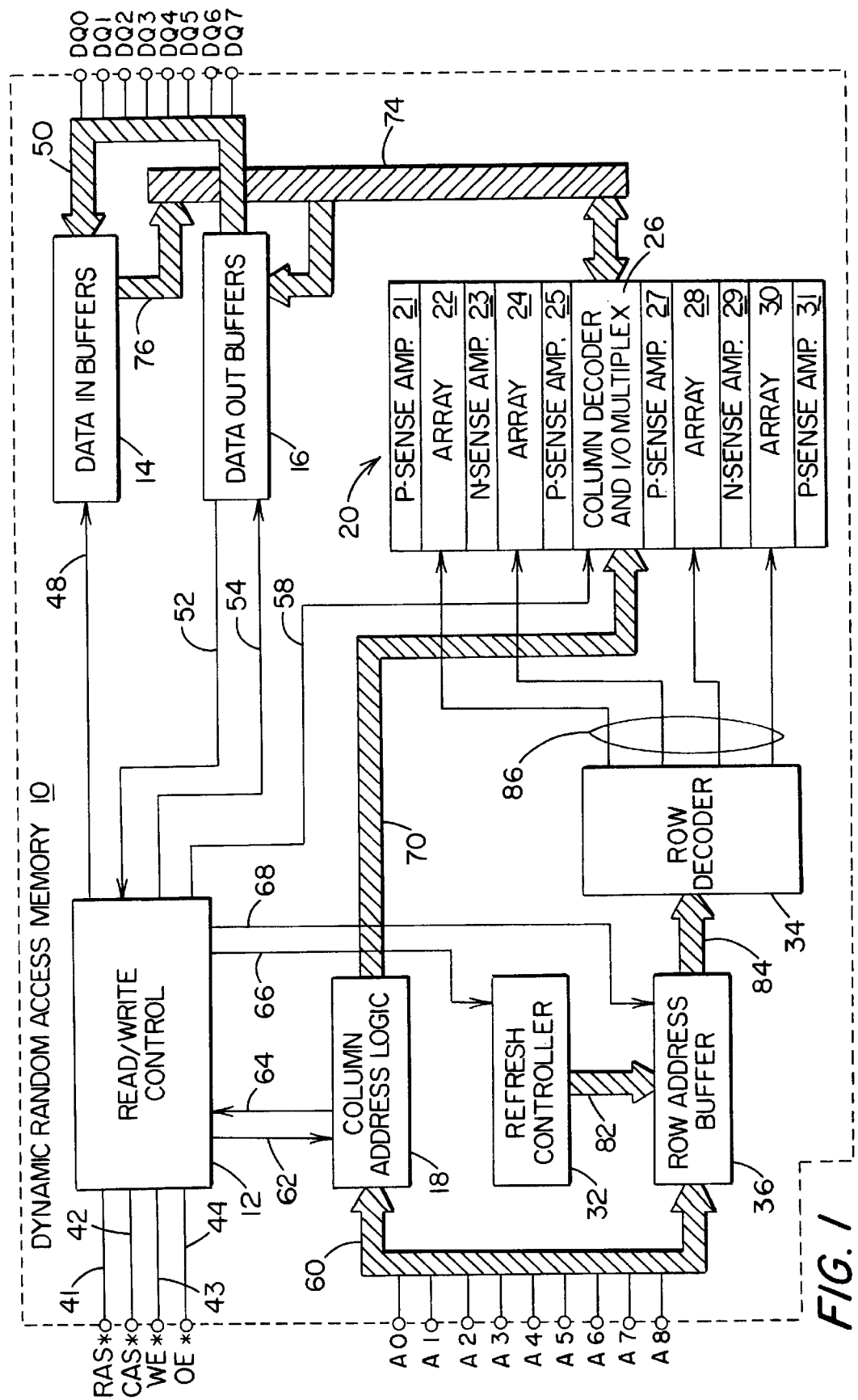
FIG. 1 is a functional block diagram of a dynamic random access memory device of the present invention.

FIG. 1 is a functional block diagram of a dynamic random access memory device 10 of the present invention. Memory device 10 is controlled by binary control signals 41–44 input from the device pads to read/write control 12. Control signals 41–44 are conventionally known by names corresponding to the primary function of each signal. Signal 41 is row address strobe (RAS*). Signal 42 is column address strobe (CAS*). Signal 43 is write enable (WE*). Signal 44 is output enable (OE*). When RAS* falls, the state of an address bus 60 is latched in a row address buffer 36 in response to control signals 68. When CAS* falls, the state of the address bus 60 is latched in column address logic 18 in response to control signals 62. Read/Write control 12 also responds to changes in the column address as indicated by address change signals 64 for improved read access time as in page mode.

Several read and write modes of operation are conducted by read/write control 12 in response to combinations of control signals 41–44 and address change signals 64. Refresh mode is one such operation conducted when RAS* is pulsed while CAS* is low. During refresh mode, a refresh controller 32 generates a refresh row address bus 82 in response to control signals 66. The row address buffer 36 provides a row address bus 84 to a row decoder 34. The binary row address bus 84, in response to control signals 68, represents either the address latched when RAS* falls or the refresh row address, depending on the mode of operation.

A single memory cell of a memory array 20 is selected for read and write operations according to the intersection of a decoded row signal and a decoded column signal. The binary row address bus 84 is coupled to the row decoder 34. The row decoder 34 asserts a row select signal on one or more row activating signal lines 86. The column address logic 18 presents a binary column address bus 70 to column decoder 26. The column decoder 26 asserts a signal to be discussed on FIG. 2 to be used by the column decoder 26 for selecting one or more columns, selecting a pair of I/O lines, and coupling those lines to global I/O signals 74. If the row decoder 34 and the column decoder 26 provide signals that activate more than one memory cell from memory array 28, further selection is accomplished by decoding circuitry in column decoder 26. Memory array 20 is organized in a multiple of four arrays 22, 24, 28, and 30. P-sense amplifiers 21, 25, 27, and 31 are located along digit line pairs (not shown). N-sense amplifiers 23 and 29 are located along the digit line pair, optimally, at or near the midpoint of the distributed capacitance of one of the digit lines.

Sense amplifiers (both P-sense amplifiers and N-sense amplifiers) perform several functions responsive to control signals 58 shown generally coupled to memory array 20. In refresh mode of operation, the content of a memory cell is refreshed by sense amplifiers. When cell contents are to be overwritten in a write operation, sense amplifiers establish proper cell contents in response to write data signals 76 from data in buffers 14. In read operations cell contents are amplified and presented to data out buffers 16 on global I/O signals 74.

Data in buffers 14 are instrumental for write operations. Data in buffers 14 are driven by data bus 50 which comprises several individual data lines shown as DQn. Alternate memory devices may have less or more DQ lines and may have separate lines for data in (D) function and the data out (Q) function. As shown, memory device 10 has eight DQ lines, each of which is bidirectional. Each bidirectional line is driven by a three state circuit to represent a logic low, a logic high, or an off state. In the off state, the three state circuit connects a high impedance to the DQ line so that drive circuits external to memory device 10 can drive a signal onto the DQ line for data in buffer 14.

Improved write operation is made possible in the present invention by the cooperation of data in buffers 14, read/write control 12, and circuits shown generally on FIG. 1 as sense amplifiers and column decoder 26. In response to current and anticipated modes of operation indicated by control signals 41–44, read/write control 12 provides control signals 48 to data in buffers 14. We now turn to describe a portion of memory array 20.

Figure 2:
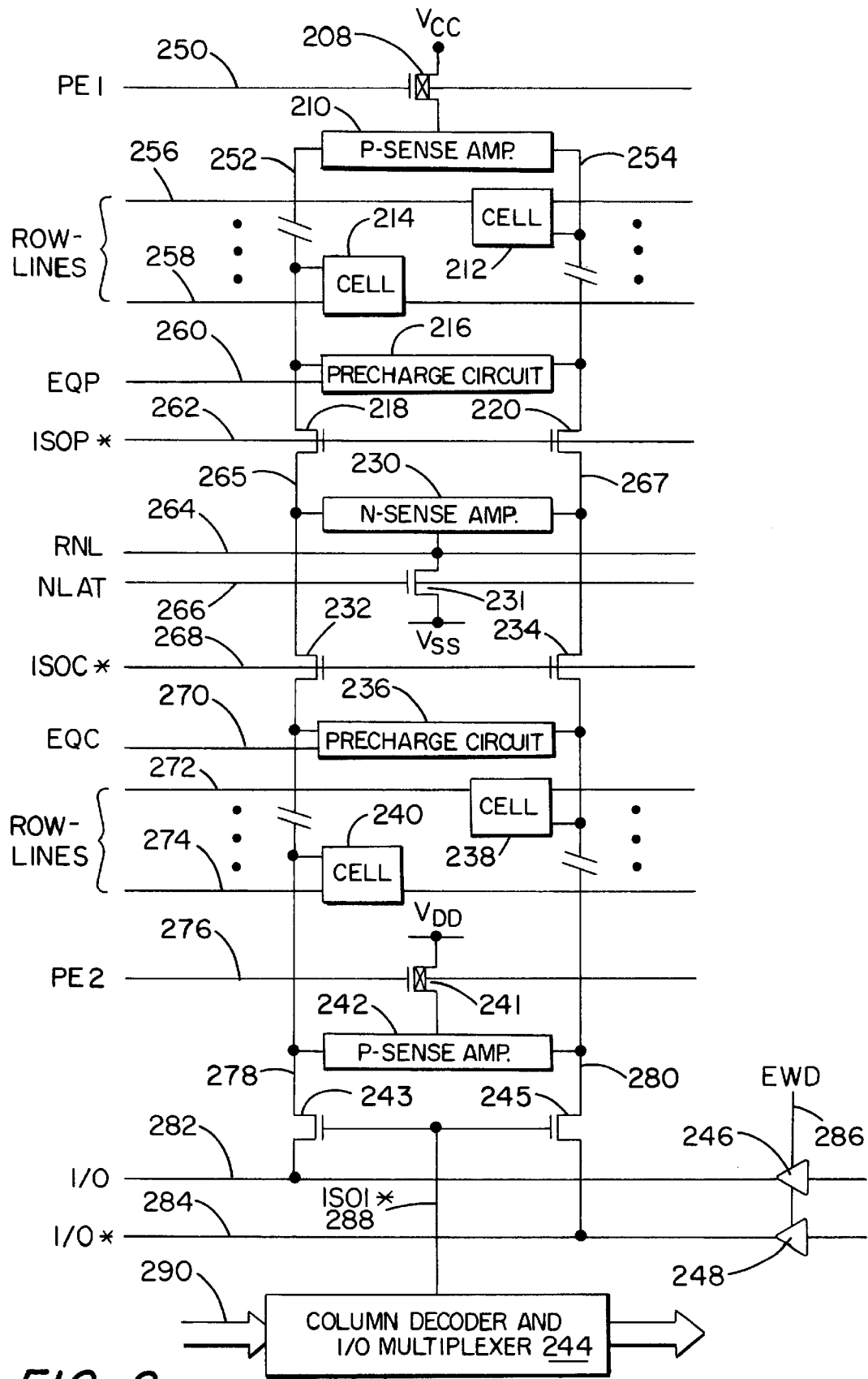
FIG. 2 is a functional block diagram of a portion of the memory array and sense amplifiers of the memory device shown in FIG. 1.

FIG. 2 is a schematic diagram of a portion of memory array 20 shown in FIG. 1. FIG. 2 depicts circuitry associated with 4 digit lines making up two column lines. Each column line is divided into two digit lines by isolation devices to be discussed. For example, a first digit line 252 extends from a P-sense amplifier 210 down to a first isolation device 218. A digit line 278 extends from an isolation device 232 to a P-sense amplifier 242. An Isolation device 243 then connects the column line (comprising digit lines 252 and 278) to an I/O line 282. In a similar manner, the complementary column line is divided into sections by isolation devices 220, 234, and 245. It is conventional, though somewhat confusing, to describe digit lines 252, 278, 254 and 280 as a column, though it is more properly a pair of column lines.

P-sense amplifier 210 acts as an active pull up subcircuit. It is enabled by a PE1 signal 250 through a device 208. In operation, P-sense amplifier 210 provides a pull up voltage to one of the two digit lines 252 and 254.

There are four memory cells shown in FIG. 2: cell 212, 214, 238, and 240. Each cell is enabled by one of row lines 256, 258, 272, and 274, respectively. Only one row line is active at a time, thereby, connecting only one cell to a digit line. When row line 256 is active, cell 212 is connected to digit line 254 and digit line 252 would not have a cell connected to it.

A precharge circuit 216 is enabled by an EQP signal 260. The precharge circuit 216 establishes equilibration voltages and set up conditions on digit lines 252 and 254. Isolation devices 218 and 220 are enabled by an ISOP* signal 262. When active, ISOP* decouples digit lines 252 and 254 from an N-sense amplifier 230.

N-sense amplifier 230 provides an active pull down subcircuit. It is enabled through a device 231 by an RNL signal 264 and an NLAT signal 266. Isolation devices 232 and 234 are enabled by an ISOC* signal 268. When active, ISOC* decouples digit lines 278 and 280 from N-sense amplifier 230.

A precharge circuit 236 is enabled by an EQC signal 270. The precharge circuit 236 operates similarly to precharged circuit 216. P-sense amplifier 242 functions similarly to P-sense amplifier 210. P-sense amplifier 242 is enabled by a PE2 signal 276 through a device 241. Digit lines 278 and 280 are coupled to I/O line 282 and 284 respectively through isolation devices 243 and 245. Isolation devices 243 and 245 are enabled by an ISOI* signal 288. A column decoder 244 provides a signal ISOI* 288 in response to a portion of column address bus 70 (shown in FIG. 1) depicted in FIG. 2 as column address signals 290.

Drivers 246 and 248 are enabled by a signal EWD signal 286. During a write operation, data signals present at the inputs of drivers 246 and 248 are driven onto I/O lines 282 and 284. The operation of the circuitry shown on FIG. 2 is best understood by referring to FIG. 3.

Figure 3:
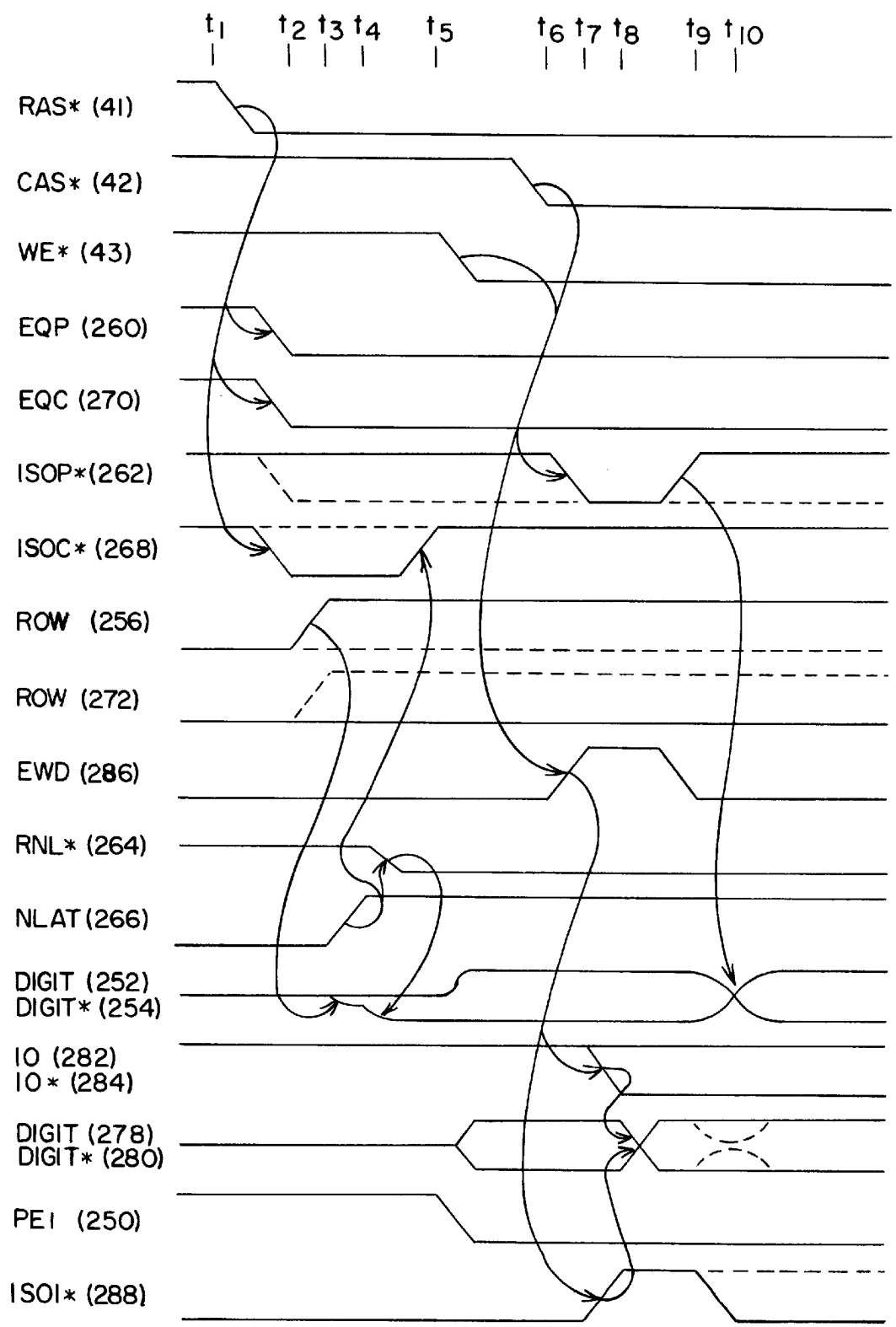
FIG. 3 is a timing diagram describing an early write method of controlling sense amplifiers and input buffer circuits shown in FIGS. 1 and 2.

FIG. 3 is a timing diagram of an early write cycle using the circuity shown in FIG. 2. A write operation to cell 212 is shown in solid lines and a write operation to cell 238 is shown in dotted lines. From time T1 to time T5, N-sense amplifier 230 attains a state corresponding to data in the addressed cell. For example, if cell 212 is addressed, digit lines 252 and 254 are coupled to N-sense amplifier 230 by operation of signal ISOP*. Digit lines 278 and 280 are isolated from N-sense amplifier 230 by operation of signal ISOC*. Finally, N-sense amplifier 230 is activated by signals RNL* and NLAT at times T3 and T4. At time TS, digit lines 252 and 254 are beginning to separate corresponding to data in the addressed cell. From time T1 to time T5, digit lines 278 and 280 have been isolated from I/O lines 282 and 284. Only the digit lines extending toward the addressed cell have been connected to N-sense amplifier 230.

At time T6 CAS* falls while WE* is low, indicating the beginning of an early write cycle. In response to CAS* falling, drivers 246 and 248 are enabled and coupled to N-sense amplifier 230. Signal ISOP* is taken low, turning off devices 218 and 220, so that the distributed capacitance of digit lines 252 and 254 does not appear as a load to drivers 246 and 248.

At time T9, a predetermined delay from time T6, signal ISOP* is raised. N-sense amplifier 230 then writes cell 212 while loaded only by the distributed capacitance of line 252 and 254. The capacitance of lines 278 and 280 can provide additional drive capability. When I/O lines 282 and 284 and drivers 246 and 248 are no longer needed, signals ISOI* and EWD are dropped. The pulse widths of signals ISOI* and EWD result from predetermined delays measured from the rising edge of each signal, respectively. Because the charge from digit lines 278 and 280 can be used to provide additional drive capability, the voltage on these lines may droop as shown at time T10. Although signal ISOI* is shown falling at time T9, the pulse width of ISOI* could be lengthened as shown by the dotted line extending from time T9 through time T10.

Figure 4A:
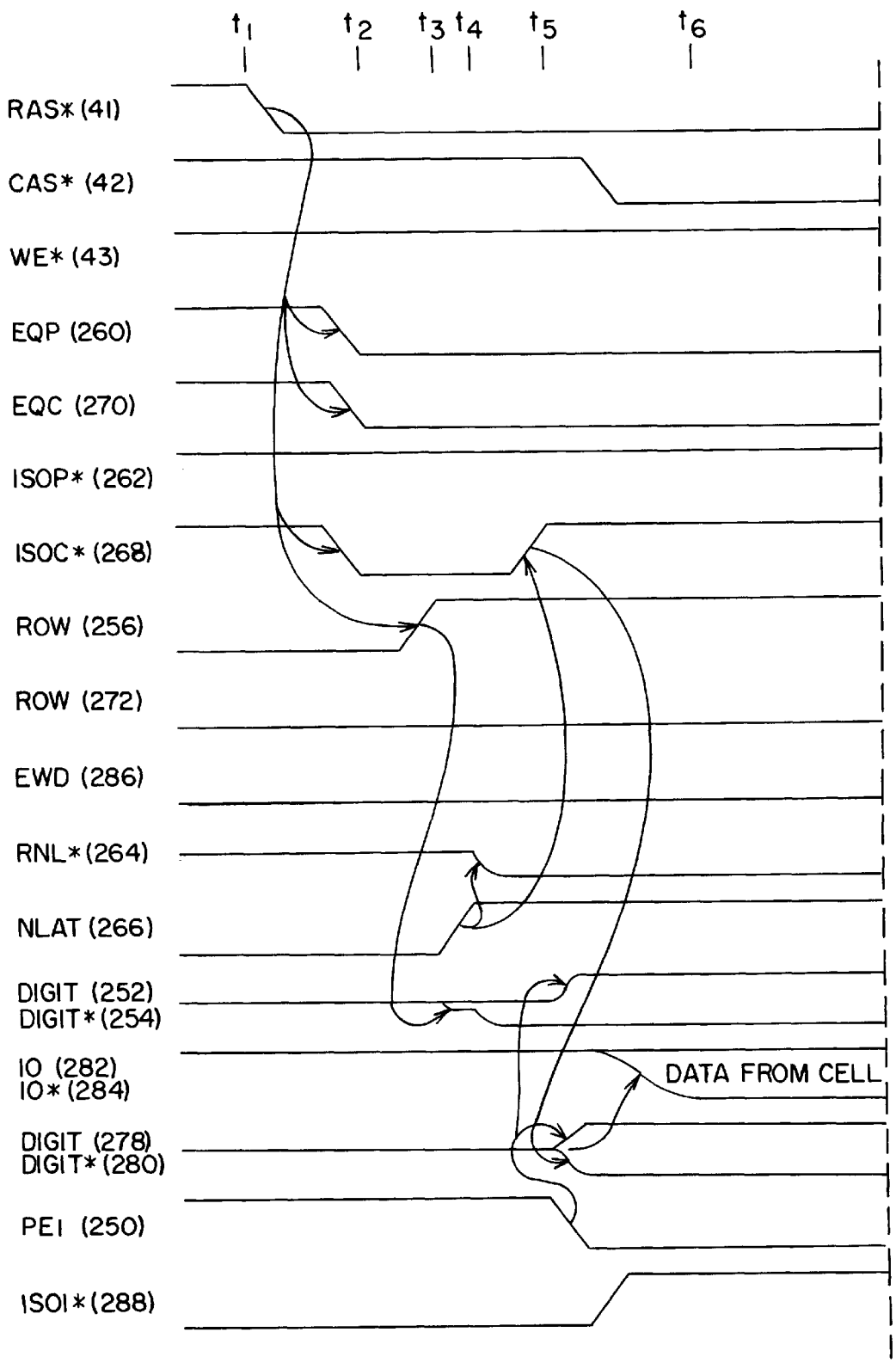
FIG. 4a and FIG. 4b present a timing diagram describing a read-write method of controlling sense amplifiers and input buffer circuits shown in FIGS. 1 and 2.
Figure 4B:
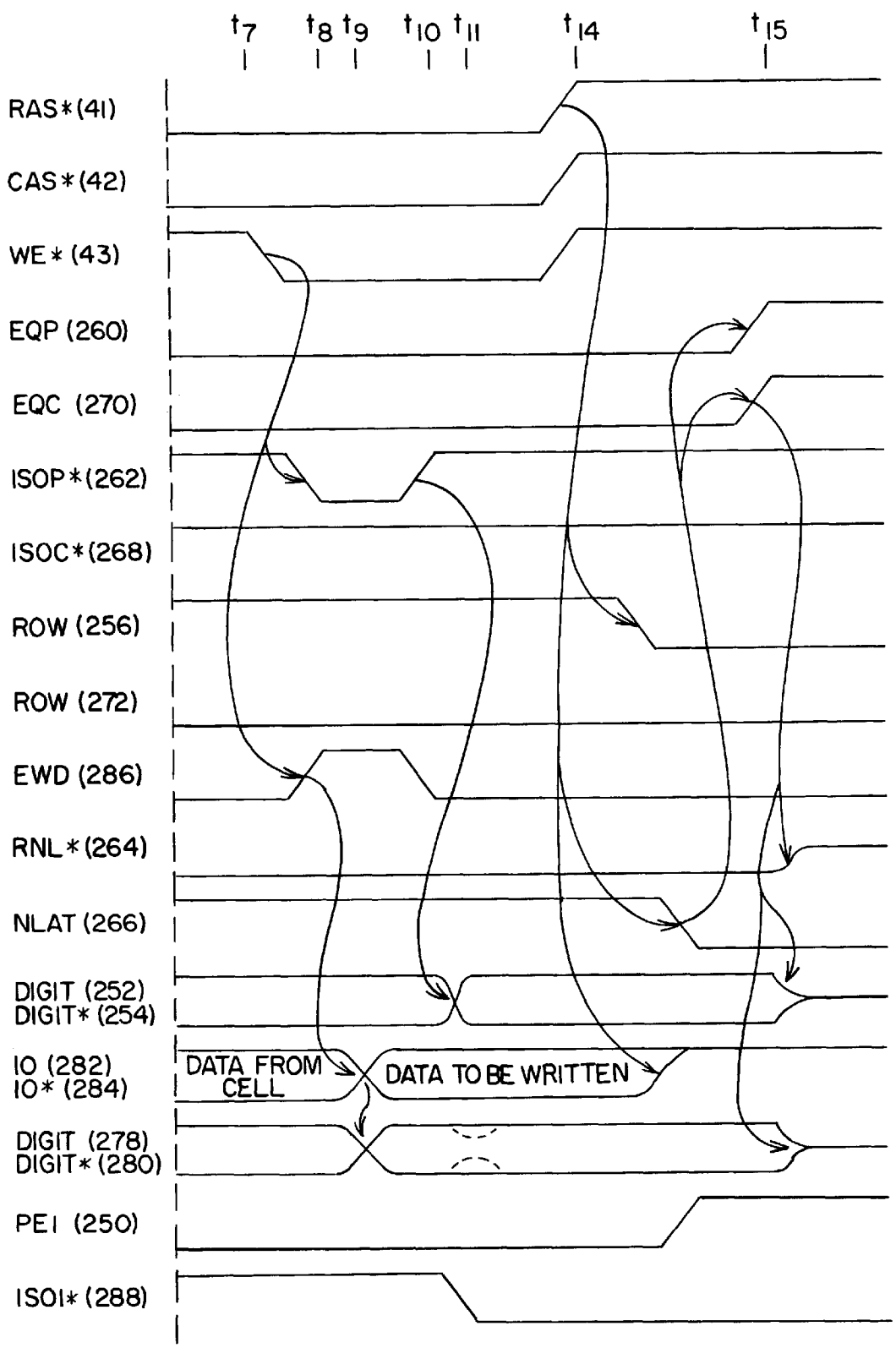

FIGS. 4a and 4b present a timing diagram of a read-modify-write cycle using the circuity shown in FIG. 2, particularly cell 212. From time T1 to time T5, N-sense amplifier 230 attains a state corresponding to data in cell 212 in a manner as already described for FIG. 3. Data from the cell appears on I/O lines 282 and 284 at time T6.

At time T7 WE* falls while CAS* is low, indicating the beginning of the write portion of the read-modify-write cycle. Events from time T8 to time T11 correspond to those events already described in FIG. 3 from time T7 to time T10. Specifically, driver 246 and 248 are enabled and coupled to N-sense amplifier 230. After N-sense amplifier 230 attains a state corresponding to input data from drivers 246 and 248, ISOP* signal 262 returns high, allowing N-sense amplifier 230 to write cell 212. While ISOC* signal 268 is low, N-sense amplifier 230 is loaded only by the distribute capacitance of line 252.

Figure 5:
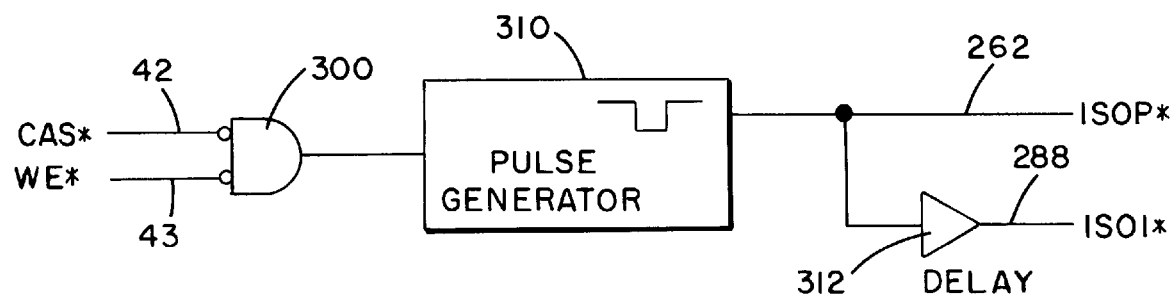
FIG. 5 is a schematic diagram of a portion of read/write control shown in FIG. 1.

FIG. 5 is a schematic diagram of a portion of read write control 12 shown on FIG. 1. Pulse generator 310 is triggered by CAS* signal 42 and WE* signal 43 to provide a low going pulse on ISOP* signal 262. ISOI* signal 288 is derived from signal ISOP* after a delay imposed by circuit 312.

Figure 6:
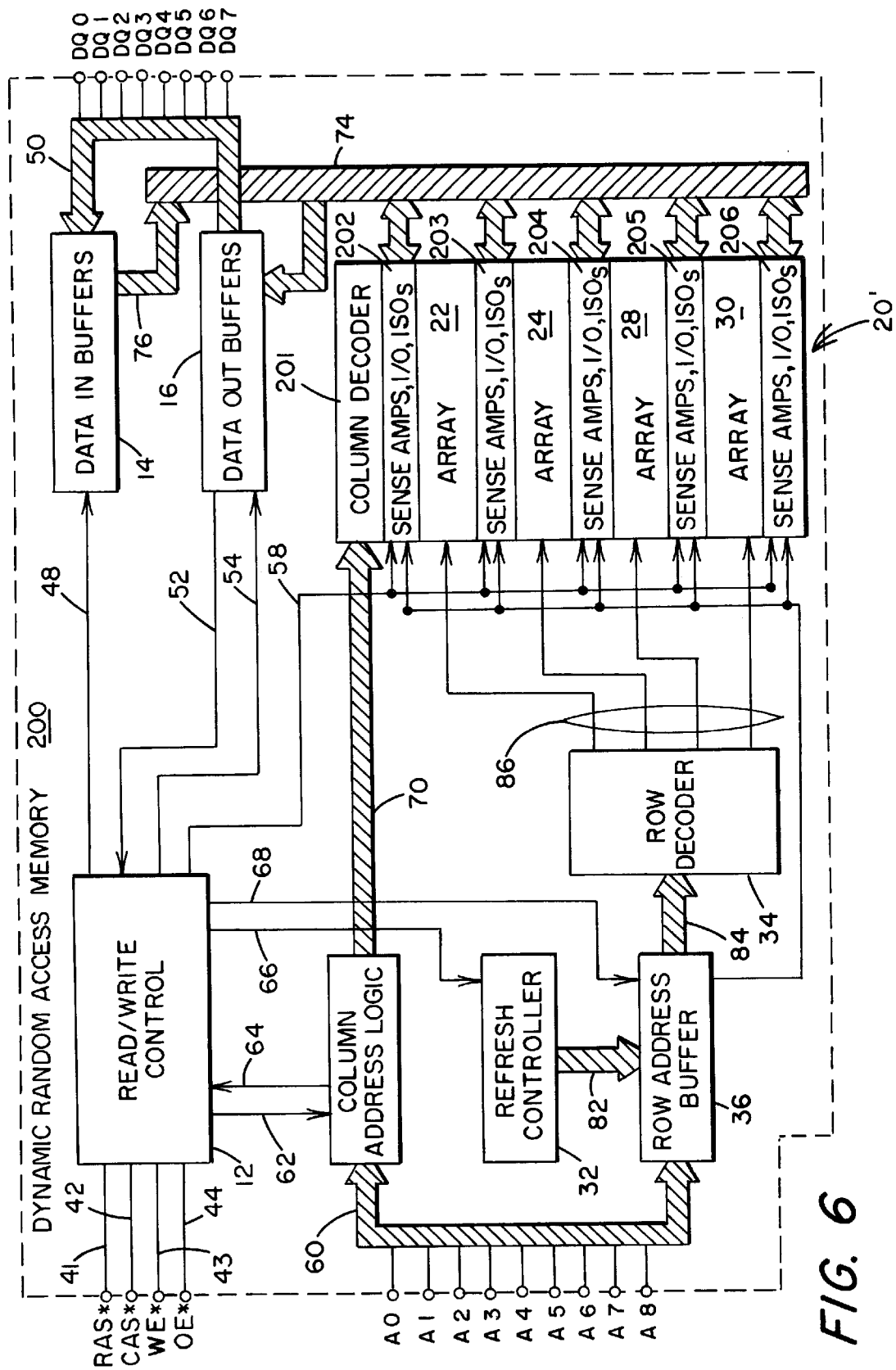
FIG. 6 is a functional block diagram of another embodiment of a dynamic random access memory device constructed according to the teachings of the present invention.

FIG. 6 is a functional block diagram illustrating another embodiment of a dynamic random access memory device 200 constructed according to the teachings of the present invention. The structure of the dynamic random access memory 200 shown in FIG. 6 is essentially the same as that of the dynamic random access memory 10 illustrated in FIG. 1 except in the area of the memory array 20. The memory array 20' of the dynamic random access memory 200 is organized differently from the memory array 20 of the dynamic random access memory 10. In FIG. 6, the memory array 20' is comprised of a column decoder 201 which receives the binary column address bus 70. The array 20' is also comprised of alternating support circuits and cell arrays as follows: support circuit 202, cell array 22, support circuit 203, cell array 24, support circuit 204, cell array 28, support circuit 205, cell array 30, and support circuit 206. Each of the support circuits is comprised of sense amplifiers, input-output devices, and isolation devices as described in greater detail hereinbelow. Each of the support circuits 202–206 is connected to the bus which carries global input/output signals 74.

Figure 7:
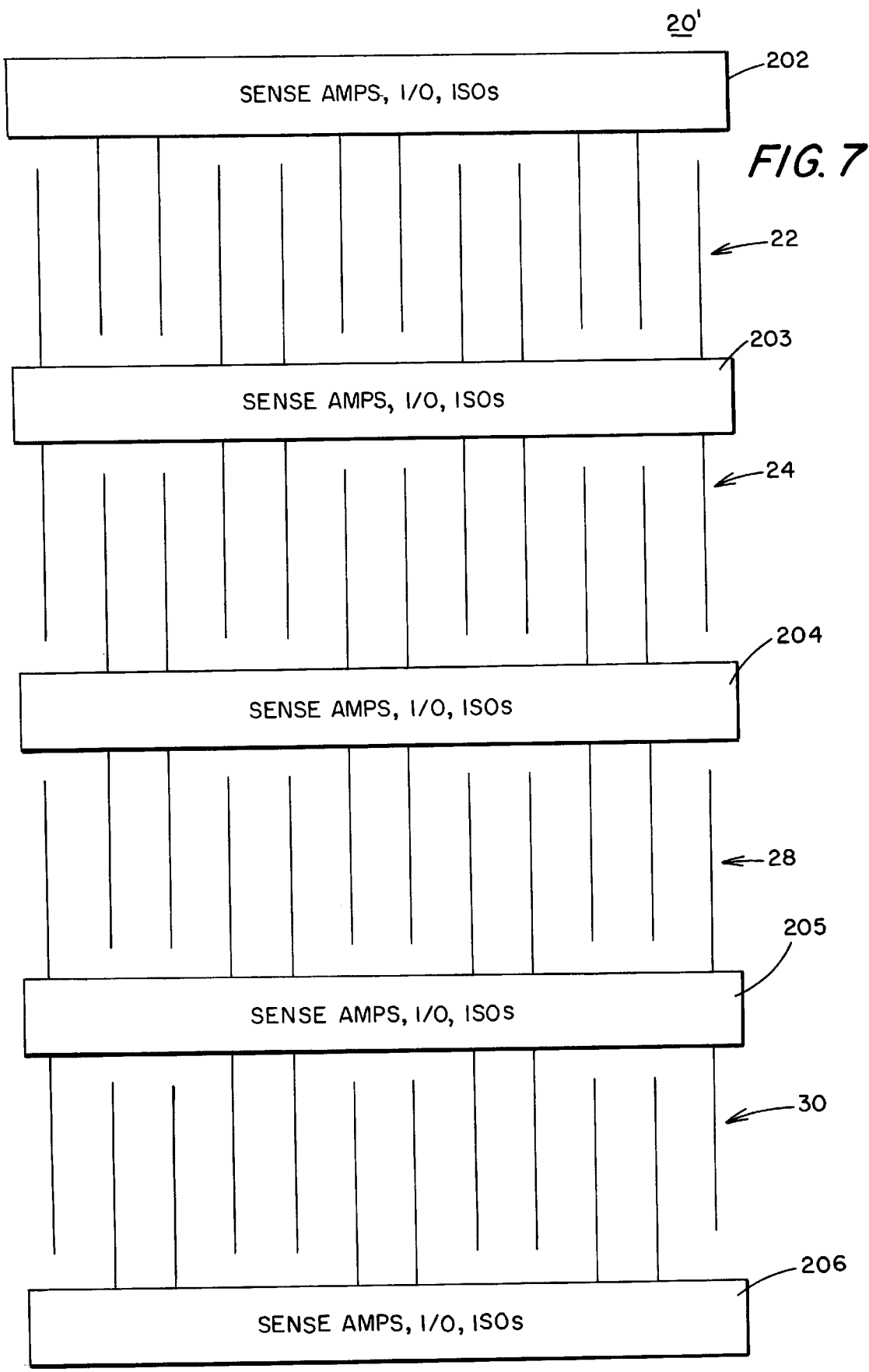
FIG. 7 is a block diagram illustrating how the digit lines may be interleaved to connect arrays of cells to double pitch sense amplifiers on each end of the digit lines.

As shown in FIG. 7, the digit lines within the arrays are interweaved to facilitate connection of cells within arrays 22, 24, 28, and 30 to double pitch support circuits 202–206. A benefit of the circuit architecture illustrated in FIG. 7 is that only one-half of the digit line associated with an active row needs to be charged because each pair making up the digit line has access to the input/output devices within support circuits 202–206 as will be described in greater detail hereinbelow.

Figure 8:
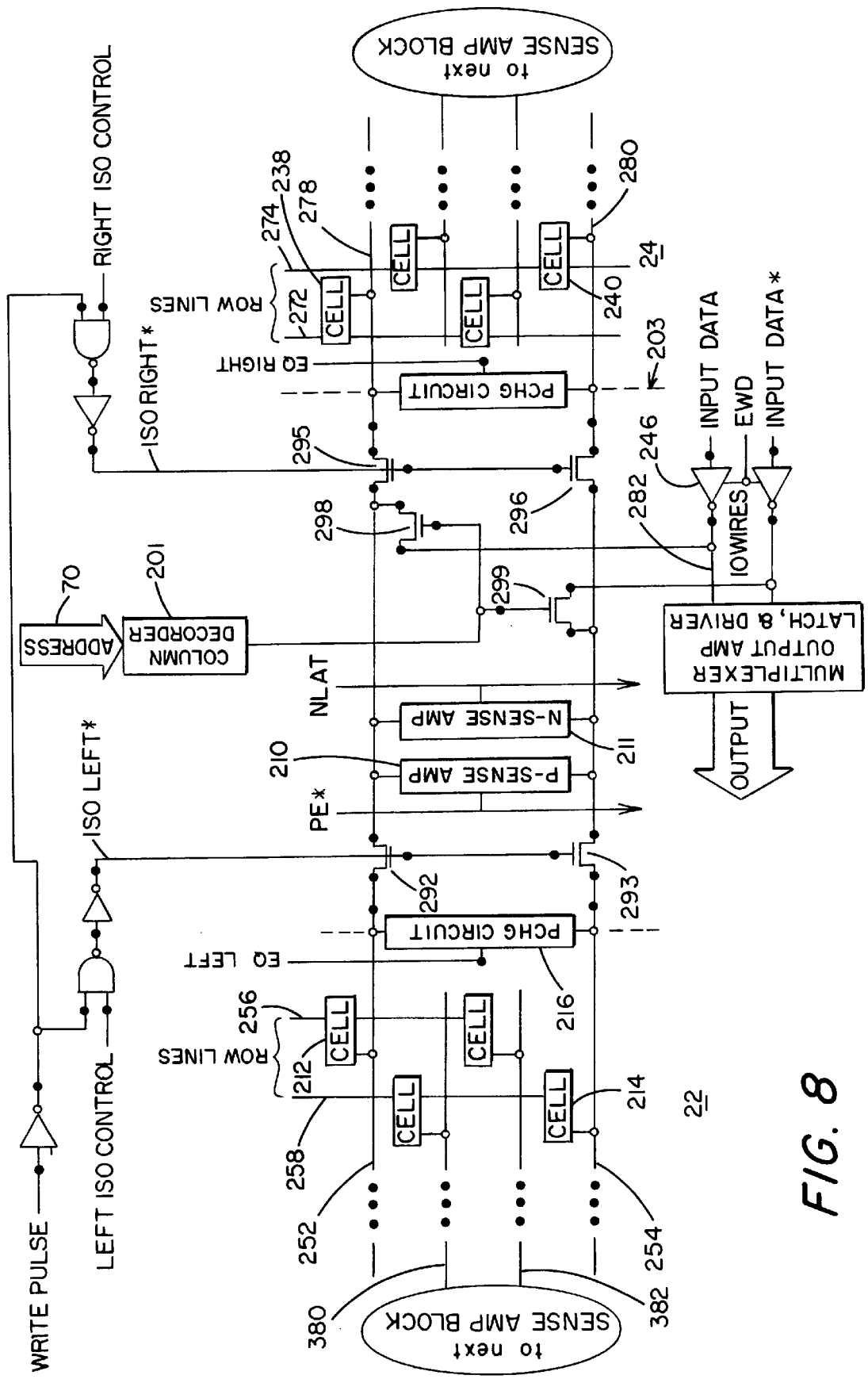
FIG. 8 is a functional block diagram of a portion of the memory array of the memory device shown in FIG. 6 according to one embodiment of the present invention.

Turning now to a description of FIG. 8, where possible the same reference numerals and mnemonics are used. As with the previous architecture, the first digit line is broken into portions 252 and 278. Similarly, the complimentary digit line is broken into portions 254 and 280. Cells 212 and 214 are illustrated in the array 22 connected to the left of support circuit 203 while cells 238 and 240 from the array 24 are connected to the right of support circuit 203.

Figure 12:
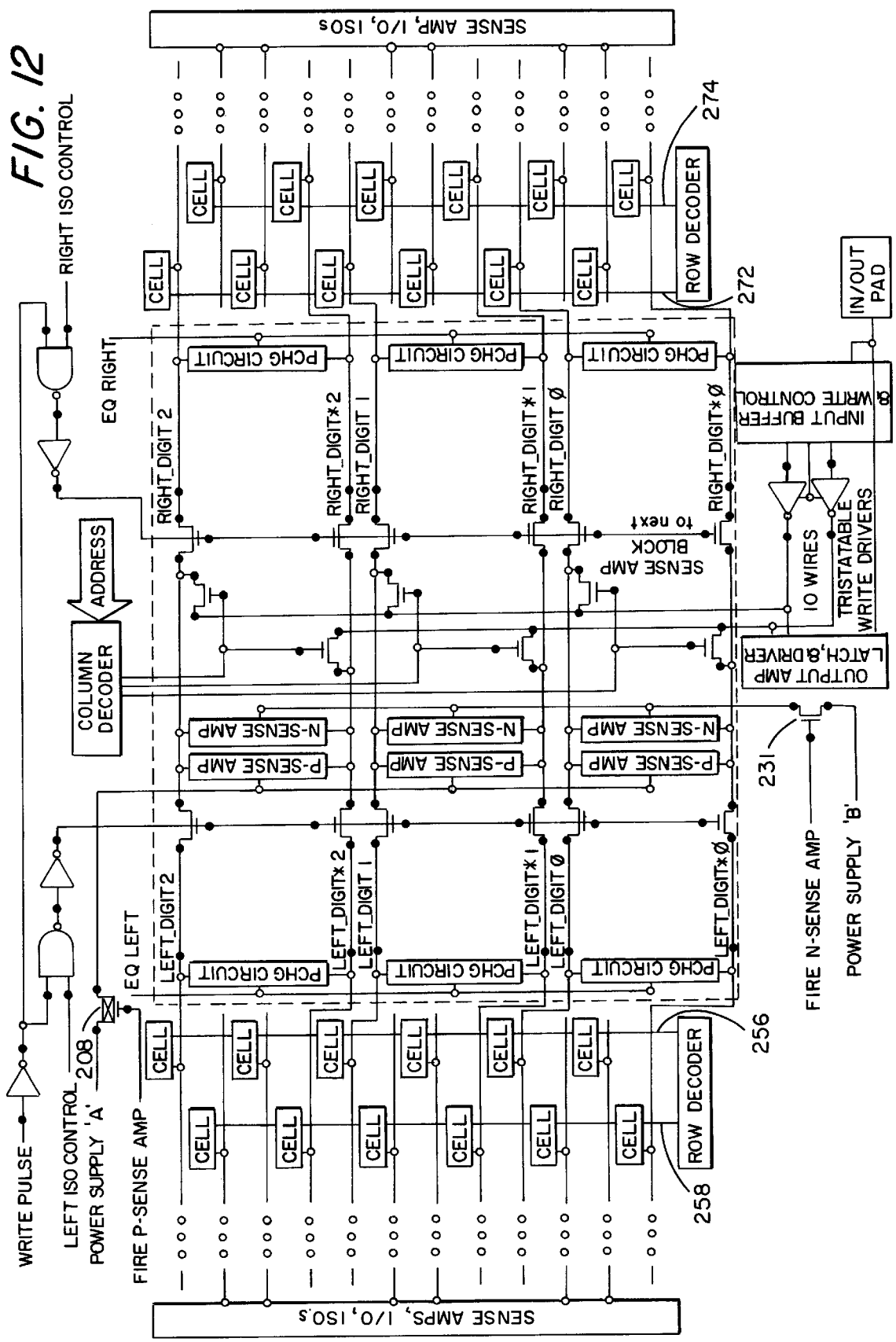
FIG. 12 is an expanded version of FIG. 8 illustrating three pair of digit lines.

Only one of the row lines 256, 258, 272, and 274 is active at a time thereby connecting only one cell to a digit line. For example, when row line 256 is active, cell 212 is connected to digit line 252. No other cell on digit lines 252, 254, 278, or 280 is active, because none of those cells' row lines is active. Other cells on row line 256 are active, and are supported by an adjacent bank of support circuitry through interlevel digit pair 380 and 382, or are associated with a neighboring digit pair as seen in FIG. 12.

The precharge circuit 216 is connected across digit lines 252 and 254 and is enabled by an EQ Left signal. As before, the precharge circuit establishes equilibration voltages and set-up conditions on digit lines 252 and 254. Connected between the precharge circuit 216 and the P-sense amplifier 210 are isolation devices 292 and 293. Isolation devices 292 and 293 are controlled by a signal ISO Left* which is a logical combination of a write pulse and a left ISO control signal.

A similar architecture exists for the right portion of the circuit shown in FIG. 8. Specifically, the precharge circuit 236 is enabled by a signal EQ Right. The precharge circuit 236 establishes equilibration voltages and set-up conditions on digit lines 278 and 280. Connected between precharge circuit 236 and N-sense amplifier 211 are isolation devices 295 and 296. The isolation devices 295 and 296 are enabled by a signal ISO Right* which is the logical combination of the write pulse and a right ISO control signal.

Completing the description of the circuit shown in FIG. 8, the column decoder 201 receives address information from the binary column address bus 70. The column decoder 201 operating through switches 298 and 299 determines when the digit lines 252, 278 and 254, 280 are to be connected to write drivers 246 and 248.

In the circuit described in FIG. 2, the P-sense amplifier 210 is turned off to facilitate a faster, lower power write. To turn the P-sense amplifier 210 off, however, requires a dedicated firing transistor, such as device 208 in FIG. 2. When the array shrinks as shown in FIG. 7 and dual pitch sense amplifiers are employed, it may become difficult or impossible to lay out a firing transistor for each P-sense amplifier. In that case, an alternative method of saving power and time in writing is desirable. In FIG. 8, a shared firing transistor, not shown, provides a signal PE* which is provided to all of the P-sense amplifiers 210. Similarly, the N-sense amplifiers 211 are operated by a common firing transistor, not shown in FIG. 8, which produces the NLAT signal shared by all N-sense amplifiers. Note that the PE* and NLAT signals of FIG. 8 do not match their use in FIG. 2, where they are the signals which fire the switching transistors rather than the signals output by the switching transistor as shown in FIG. 8.

Figure 9:
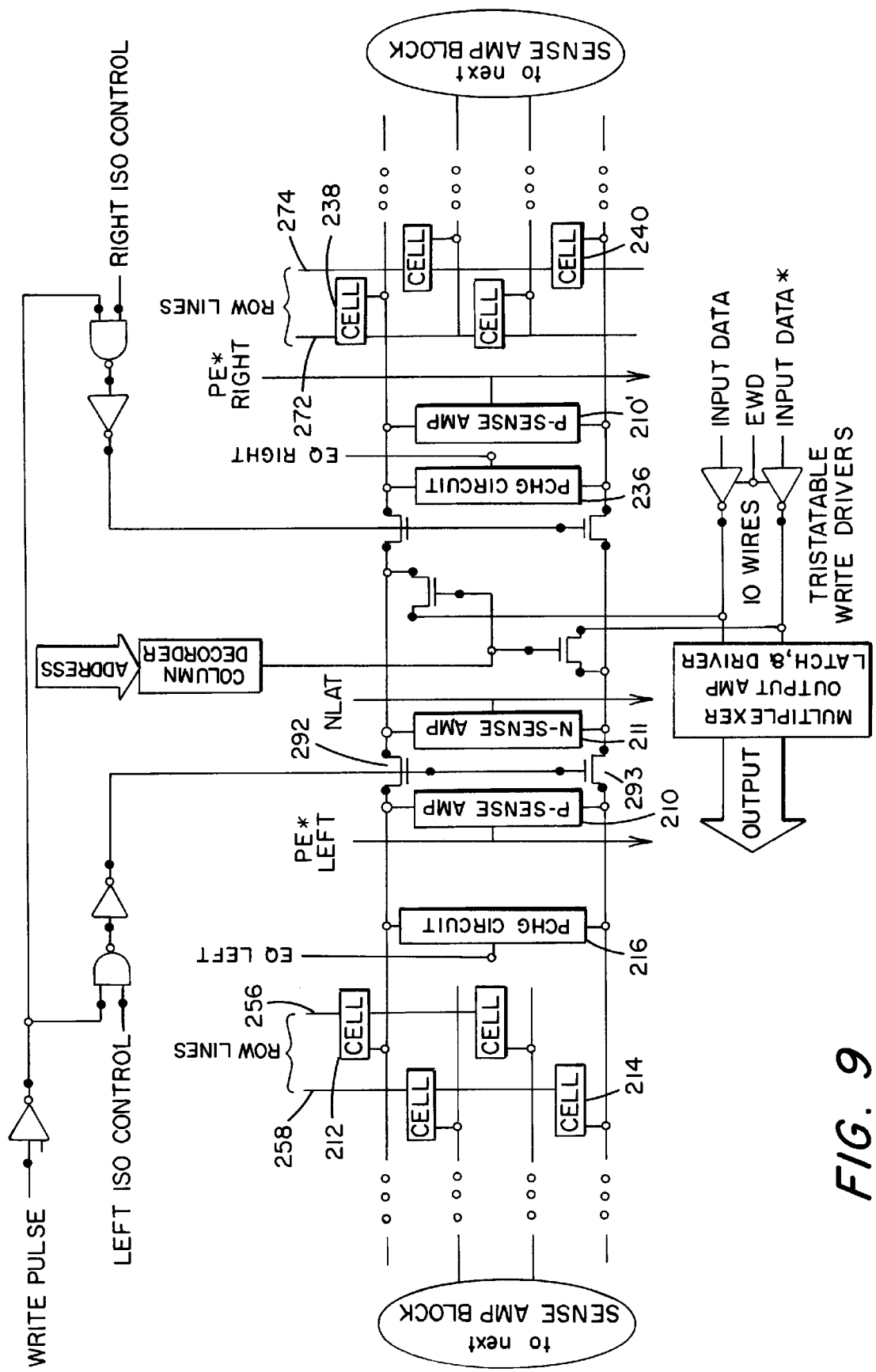
FIG. 9 is a functional block diagram of a portion of the memory-array of the memory device shown in FIG. 6 according to another embodiment of the present invention.

Two phenomena combine to make writes slow and power hungry. First, there is large capacitance associated with the digit lines. Assuming that the written data is opposite to the existing data, the charge stored in that capacitance must be reversed thereby consuming power and time. Second, where the P-sense amplifier 210 and the N-sense amplifier 211 cannot be completely shut off by dedicated firing transistors, the combination of the amplifiers forms a latch which must be overwritten. Writing against the latch consumes active current until completed, using less current if the overwrite is completed quickly. That second problem can be overcome by using the circuit shown in FIG. 9. The circuit shown in FIG. 9 is essentially the same as the circuit shown in FIG. 8 except that the P-sense amplifier 210 is moved to the other side of isolation devices 292 and 293. As a result, another P-sense amplifier 210' must be added on the other side of isolation devices 295 and 296. As will be described in greater detail in conjunction with the timing diagrams associated with FIGS. 8 and 9, by moving the P-sense amplifiers 210 and 210' the problem of having to overwrite the latch formed by the P-sense amplifier and the N-sense amplifier is eliminated.

Because an N-channel FET can only pass a voltage equal to $V_{gs}-V_t$, use of the circuit of FIG. 8 requires use of some well known method of boosting isolation gate voltage to at least $V_{dd}+V_t$ to write full $V_{dd}$ levels into the storage cells. That assumes N-channel isolation devices but P-channel devices have a similar problem writing full $V_{ss}$ levels to the array.

Figure 10:
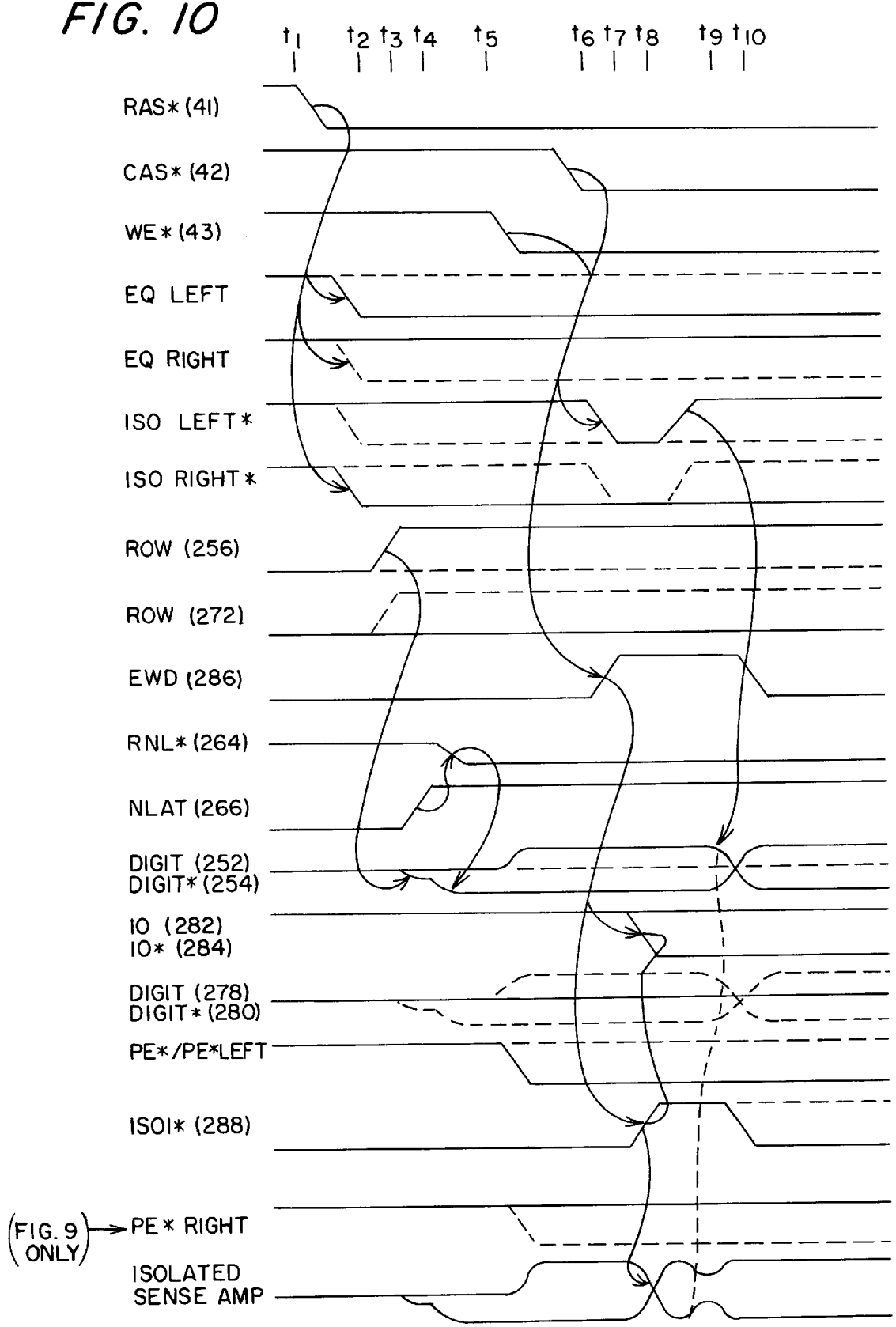
FIG. 10 is a timing diagram describing an early write method of controlling sense amplifiers and input buffers shown in FIGS. 6, 8, and 9.

FIG. 10 is a timing diagram describing an early write method of controlling the circuit shown in FIG. 8. In FIG. 8, the active digit pair is isolated during the write, the other side is already isolated, thereby allowing the write drivers 246 and 248 to overwrite the sense amp latch without the digit capacitance. For example, assuming a write operation to cell 212, the signal ISO Left* goes high until approximately time T6 so that cell 212 is connected to N-sense amplifier 211. As before, the connection of the cell 212 to N-sense amplifier 211 allows N-sense amplifier 211 to assume the same state as the state of the data contained by cell 212. Thereafter, the ISO Left signal goes low at the same time that the signals needed to enable write drivers 246 and 248 go high. That enables write drivers 246 and 248 to write the new data to the latch formed by the P-sense amplifier 210 and the N-sense amplifier 211 while the capacitance associated with the data line segments 252 and 254 is isolated. After the latch formed by the P-sense amplifier 210 and the N-sense amplifier 211 has been written, the signal ISO Left* goes high. However, unlike the earlier described embodiment of the present invention, the write drivers remain operative so that the cell 212 is written by the combination of the N-sense amplifier 211 and the write drivers 246 and 248. Even though the write drivers need to remain active after the digit pair 252 and 254 is reconnected to the sense amplifiers, the isolation time can be made very short because the sense amplifiers can be overwritten without having to drive any digit capacitance. Therefore, the total time required for a write operation with the circuitry shown in FIG. 8 is similar to that for the circuit shown in FIG. 2. The dotted lines in FIG. 10 illustrate a write operation to cell 238. Finally, the timing diagram at the very bottom of FIG. 10 illustrates the state of the N-sense amplifier 211 (FIG. 9) or N and P-sense amplifier combination 210, 211, whichever is isolated.

The timing diagram of FIG. 10 is also applicable to the circuit shown in FIG. 9. The signal PE* Left is the same as the signal PE*. An additional signal, PE* Right, is required for the additional P-sense amp 210'.

The circuitry of FIG. 9 may be used to simplify isolation design. With the embodiment of FIG. 9, the N-sense amplifier switches when the write drivers are activated. The N-sense amplifier helps to pull charge off the high digit line when it is reconnected. Once the high digit line is low, the N-sense amplifier and the P-sense amplifier are again latched but they now reflect the new data.

FIGS. 11A and 11B represent a timing diagram of a read-modify-write cycle using the circuitry shown in FIGS. 8 and 9, particularly with respect to cell 212. From time T1 to time T5, N-sense amplifier 211 attains a state corresponding to the state of data in cell 212 in a manner as previously described. Data from the cell appears on I/O lines 282 and 284 at time T6. At time T7 the signal WE falls while the signal CAS* is low indicating the beginning of the write portion of the read-modify-write cycle. The events from T8 to T11 have already been described in conjunction with FIG. 10. Specifically, N-sense amplifier 211 attains a state corresponding to the state of the input data. While the signal ISO Left* is low, N-sense amplifier 211, in the case of FIG. 9, or the combination of N and P-sense amplifiers 210 and 211, in FIG. 8, are isolated from the capacitance of the digit lines 252 and 254 and written by drivers 246 and 248. Then the signal ISO Left* goes high allowing the sense amplifier 211, in the case of FIG. 9, or the combination of N and P-sense amplifiers 210 and 211, in FIG. 8, and drivers 246 and 248 to write cell 212.

FIG. 12 reflects the same circuit design as that shown in FIG. 8 except that three pair of digit lines: are illustrated.

Figure 13:
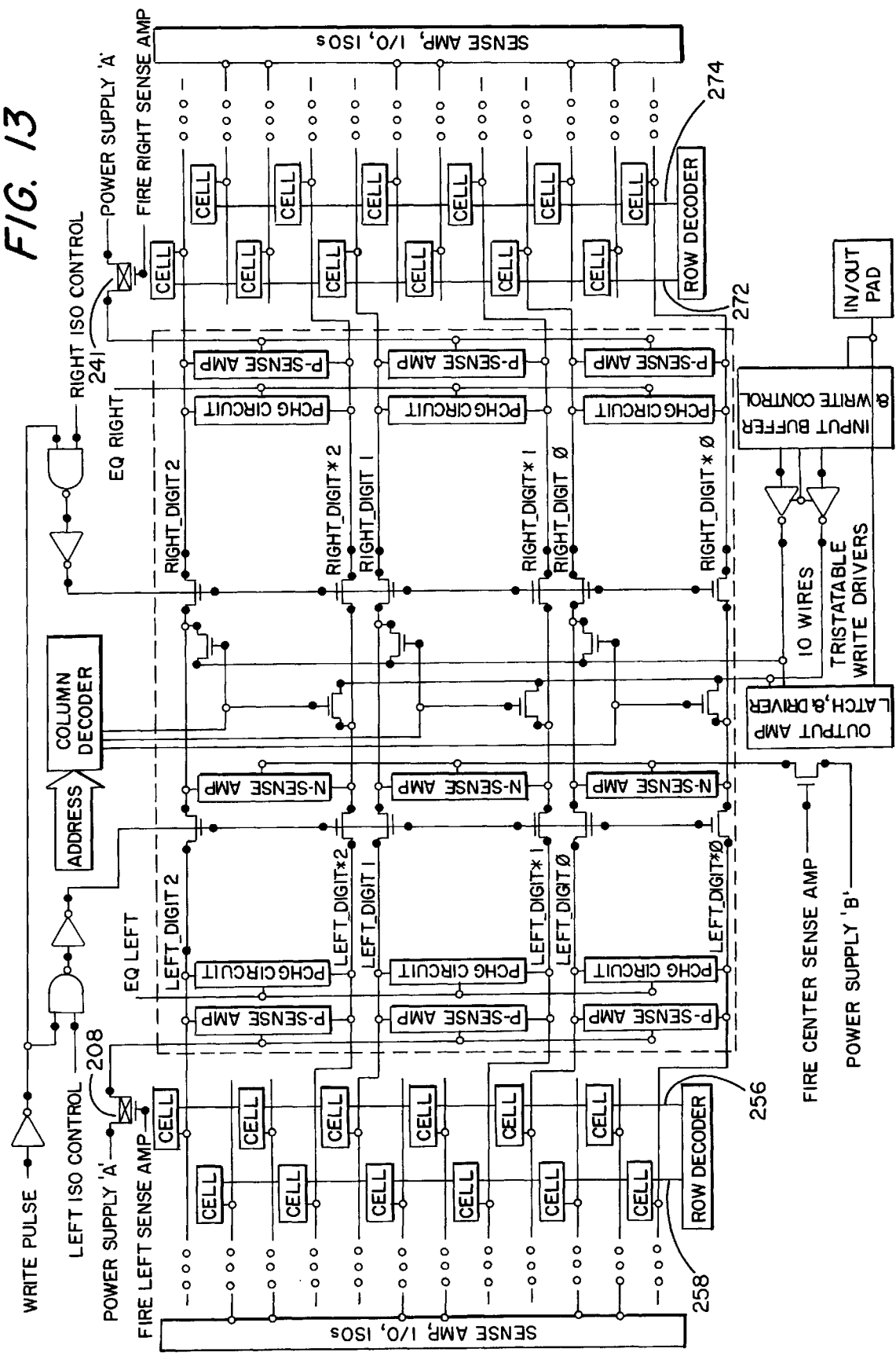
FIG. 13 is an expanded version of FIG. 9 illustrating three pair of -digit lines.

Similarly, FIG. 13 reflects the same circuit design as that shown in FIG. 9, except that three pair of digit lines are shown. Those figures illustrate the sharing of firing transistors 208, 231, and 241 as well as the manner in which row lines 256, 258, 272, 274 connect cells to interleaved and neighboring digit lines.

The foregoing description discusses preferred embodiments of the present invention, which may be changed or modified without departing from the scope of the present invention. Those skilled in the art will understand that the logical elements described above may be formed using a wide variety of logical gates employing any polarity of input or output signals and that the logical values described above may be implemented using different voltage polarities. These and other changes and modifications are intended to be included within the scope of the present invention.

While for the sake of clarity and ease of description, several specific embodiments of the invention have been described, the scope of the invention is intended to be measured by the claims as set forth below. Other embodiments of the invention will be apparent in light of the disclosure to one of ordinary skill in the arts to which the invention applies. For example, P-channel FETS may be substituted for N-channel FETS (and vice versa) in some applications with appropriate polarity changes in controlling signals as required. Moreover, the P-channel and N-channel FETS discussed above generally represent active devices which may be replaced with bipolar or other technology active devices.

The words and phrases used throughout the specification and the claims are intended to be broadly construed. A "system" refers generally to electrical apparatus and includes, but is not limited to, a packaged integrated circuit, an unpackaged integrated circuit, a combination of packaged or unpackaged integrated circuits or both, a microprocessor, a microcontroller, a memory, a register, a flip-flop, a charge-coupled device, combinations thereof, and equivalents. A "signal" refers to mechanical and/or electromagnetic energy conveying information. When elements are coupled, a signal can be conveyed in any manner feasible in light of the nature of the coupling. For example, if several electrical conductors couple two elements, then the relevant signal comprises the energy on one, some, or all conductors at a given time or time period. When a physical property of a signal has a quantitative measure and the property is used by design to control or communicate information, then the signal is said to be characterized by having a "value." for a binary (digital) signal, the two characteristic values are called logic "states."

What is claimed is:

1. A circuit connected to a data line, comprising:
   a column line connected to the data line, said column line having a first portion, a second portion, and a third portion;
   a dynamic memory cell connected to said column line;
   an amplifier connected to said column line;
   a first switch having a first terminal, a second terminal, and a gate terminal, said first terminal connected to said first portion of said column line, said second terminal connected to said second portion of said column line, and said gate terminal responsive to a first switch control signal so that said first switch isolates said amplifier from said cell while said amplifier is connected to the data line; and
   a second switch having a first terminal, a second terminal, and a gate terminal, said first terminal connected to said second portion of said column line, said second terminal connected to said third portion of said column line, and said gate terminal responsive to a second switch control signal so that said second switch isolates said amplifier from the data line before said amplifier is connected to said cell.

2. The circuit of claim 1 wherein said second switch includes a transistor.

3. A circuit connected to a data line, comprising:
   a column line connected to the data line, said column line having a first portion, a second portion, and a third portion;
   a dynamic memory cell connected to said column line;
   a control circuit having a first output terminal and a second output terminal;
   an amplifier connected to said column line;
   a first switch having a first terminal, a second terminal, and a gate terminal, said first terminal connected to said first portion of said column line, said second terminal connected to said second portion of said column line, and said gate terminal connected to said first output terminal of said control circuit so that said first switch isolates said amplifier from said cell while said amplifier is connected to the data line; and
   a second switch having a first terminal, a second terminal, and a gate terminal, said first terminal connected to said second portion of said column line, said second terminal connected to said third portion of said column line, and said gate terminal connected to said second output terminal of said control circuit so that said second switch isolates said amplifier from the data line before said amplifier is connected to said cell.

4. A circuit connected to a data line, comprising:
   a first column line connected to the data line, said first column line having a first portion, a second portion, and a third portion;
   a second column line connected to the data line, said second column line having a first portion, a second portion, and a third portion;
   a dynamic memory cell connected to said first column line;
   an amplifier having a first terminal and a second terminal, said first terminal connected to said first column line and said second terminal connected to said second column line;
   a first switch having a first terminal, a second terminal, and a gate terminal, said first terminal connected to said first terminal of said first column line, said second terminal connected to said second portion of said first column line, and said gate terminal responsive to a first switch control signal so that said first switch isolates said amplifier from said cell while said amplifier is connected to the data line;
   a second switch having a first terminal, a second terminal, and a gate terminal, said first terminal connected to said second portion of said first column line, said second terminal connected to said third portion of said first column line, and said gate terminal responsive to a second switch control signal so that said second switch isolates said amplifier from the data line before said amplifier is connected to said cell;
   a third switch having a first terminal, a second terminal, and a gate terminal, said first terminal connected to said first portion of said second column line, said second terminal connected to said second portion of said column line, and said gate terminal responsive to said first switch control signal; and a fourth switch having a first terminal, a second terminal, and a gate terminal, said first terminal connected to said second portion of said second column line, said second terminal connected to said third portion of said second column line, and said gate terminal responsive to said second switch control signal.

5. The circuit of claim 4 further comprising a row line, said row line connected to said cell.

6. A circuit connected to a data line, comprising:

a first column line connected to the data line, said first column line having a first portion, a second portion, and a third portion;

a second column line connected to the data line, said second column line having a first portion, a second portion, and a third portion;

a dynamic memory cell connected to said first column line;

a control circuit having a first output terminal and a second output terminal;

an amplifier having a first terminal and a second terminal, said first terminal connected to said first column line and said second terminal connected to said second column line;

a first switch having a first terminal, a second terminal, and a gate terminal, said first terminal connected to said first portion of said first column line, said second terminal connected to said second portion of said first column line, and said gate terminal connected to said first output terminal of said control circuit so that said first switch isolates said amplifier from said cell while said amplifier is connected to the data line;

a second switch having a first terminal, a second terminal, and a gate terminal, said first terminal connected to said second portion of said first column line, said second terminal connected to said third portion of said first column line, and said gate terminal connected to said second output terminal of said control circuit so that said second switch isolates said amplifier from the data line before said amplifier is connected to said cell;

a third switch having a first terminal, a second terminal, and a gate terminal, said first terminal connected to said first portion of said second column line, said second terminal connected to said second portion of said second column line, and said gate terminal connected to said first output terminal of said control circuit ; and a fourth switch having a first terminal, a second terminal, and a gate terminal, said first terminal connected to said second portion of said second column line, said second terminal connected to said third portion of said second column line, and said gate terminal connected to said second output terminal of said control circuit.

7. A circuit connected to a data line, comprising:

a column line connected to the data line, said column line having a first portion and a second portion;

a dynamic memory cell connected to said column line;

an amplifier connected to said column line; and a switch having a first terminal, a second terminal, and a gate terminal, said first terminal connected to said first portion of said column line, said second terminal connected to said second portion of said column line, and said gate terminal responsive to a switch control signal so that said switch isolates said amplifier from said cell while said amplifier is connected to and receives data from the data line and said first switch connects said amplifier to said cell when said amplifier is disconnected from the data line.

8. A circuit connected to a data line, comprising:

a column line connected to the data line, said column line having a first portion and a second portion;

a dynamic memory cell connected to said column line;

a control circuit having an output terminal;

an amplifier connected to said column line; and a switch having a first terminal, a second terminal, and a gate terminal, said first terminal connected to said first portion of said column line, said second terminal connected to said second portion of said column line, and said gate terminal connected to said output terminal of said control circuit so that said switch isolates said amplifier from said cell while said amplifier is connected to and receives data from the data line and said switch connects said amplifier to said cell when said amplifier is disconnected from the data line.

9. A circuit connected to a data line, comprising:

a column line connected to the data line, said column line having a first portion, a second portion, and a third portion;

a dynamic memory cell connected to said column line;

an amplifier connected to said column line;

a first switch having a first terminal, a second terminal, and a gate terminal, said first terminal connected to said first portion of said column line, said second terminal connected to said second portion of said column line, and said gate terminal responsive to a first switch control signal so that said first switch isolates said amplifier from said cell while said amplifier is connected to the data line and said first switch connects said amplifier to said cell when said amplifier is disconnected from the data line; and a second switch having a first terminal, a second terminal, and a gate terminal, said first terminal connected to said second portion of said column line, said second terminal connected to said third portion of said column line, and said gate terminal responsive to a second switch control signal so that said second switch disconnects said amplifier from the data line when said amplifier is connected to said cell.

10. A circuit connected to a data line, comprising:

a column line connected to the data line, said column line having a first portion and a second portion;

a dynamic memory cell connected to said column line;

a control circuit having a first output terminal and a second output terminal;

an amplifier connected to said column line;

a first switch having a first terminal, a second terminal, and a gate terminal, said first terminal connected to said first portion of said column line, said second terminal connected to said second portion of said column line, and said gate terminal connected to said first output terminal of said control circuit so that said first switch isolates said amplifier from said cell while said amplifier is connected to and receives data from the data line and said first switch connects said amplifier to said cell when said amplifier is disconnected from the data line; and a second switch having a first terminal, a second terminal, and a gate terminal, said first terminal connected to said second portion of said column line, said second terminal connected to said third portion of said column line, and said gate terminal connected to said second output terminal of said control circuit so that said second switch disconnects said amplifier from the data line when said amplifier is connected to said cell.

11. A circuit connected to a data line, comprising:

a first column line connected to the data line, said first column line having a first portion, a second portion, and a third portion;

a second column line connected to the data line, said second column line having a first portion, a second portion, and a third portion;

a dynamic memory cell connected to said first column line;

an amplifier having a first terminal and a second terminal, said first terminal connected to said first column line and said second terminal connected to said second column line;

a first switch having a first terminal, a second terminal, and a gate terminal, said first terminal connected to said first portion of said first column line, said second terminal connected to said second portion of said first column line, and said gate terminal responsive to a first switch control signal so that said first switch isolates said amplifier from said cell while said amplifier is connected to and receives data from the data line and said first switch connects said amplifier to said cell when said amplifier is disconnected from the data line;

a second switch having a first terminal, a second terminal, and a gate terminal, said first terminal connected to said second portion of said first column line, said second terminal connected to said second portion of said first column line, and said gate terminal responsive to a second switch control signal so that said second switch disconnects said amplifier from the data line when said amplifier is connected to said cell;

a third switch having a first terminal, a second terminal, and a gate terminal, said first terminal connected to said first portion of said second column line, said second terminal connected to said second portion of said second column line, and said gate terminal responsive to said first switch control signal; and a fourth switch having a first terminal, a second terminal, and a gate terminal, said first terminal connected to said second portion of said second column line, said second terminal connected to said third portion of said second column line, and said gate terminal responsive to said second switch control signal.

12. A circuit connected to a data line, comprising:

a first column line connected to the data line, said first column line having a first portion, a second portion, and a third portion;

a second column line connected to the data line, said second column line having a first portion, a second portion, and a third portion;

a dynamic memory cell connected to said first column line;

a control circuit having a first output terminal and a second output terminal;

an amplifier having a first terminal and a second terminal, said first terminal connected to said first column line and said second terminal connected to said second column line;

a first switch having a first terminal, a second terminal, and a gate terminal, said first terminal connected to said first portion of said first column line, said second terminal connected to said second portion of said first column line, and said gate terminal connected to a said first output terminal of said control circuit so that said first switch isolates said amplifier from said cell while said amplifier is connected to and receives data from the data line and said first switch connects said amplifier to said cell when said amplifier is disconnected from the data line;

a second switch having a first terminal, a second terminal, and a gate terminal, said first terminal connected to said second portion of said first column line, said second terminal connected to said third portion of said first column line, and said gate terminal connected to said second output terminal of said control circuit so that said second switch disconnects said amplifier from the data line when said amplifier is connected to said cell;

a third switch having a first terminal, a second terminal, and a gate terminal, said first terminal connected to said first portion of said second column line, said second terminal connected to said second portion of said second column line, and said gate terminal connected to said first output terminal of said control circuit; and a fourth switch having a first terminal, a second terminal, and a gate terminal, said first terminal connected to said second portion of said second column line, said second terminal connected to said third portion of said second column line, and said gate terminal connected to said second output terminal of said control circuit.

13. A circuit connected to a data line, comprising:

a first column line connected to the data line, said first column line having a first portion and a second portion;

a second column line connected to the data line, said second column line having a first portion and a second portion;

a dynamic memory cell connected to said first column line; an amplifier having a first terminal and a second terminal, said first terminal connected to said first column line and said second terminal connected to said second column line;

a first switch having a first terminal, a second terminal, and a gate terminal, said first terminal connected to said first portion of said first column line, said second terminal connected to said second portion of said first column line, and said gate terminal responsive to a switch control signal so that said first switch isolates said amplifier from said cell while said amplifier is connected to and receives data from the data line and said first switch connects said amplifier to said cell when said amplifier is disconnected from the data line; and a second switch having a first terminal, a second terminal, and a gate terminal, said first terminal connected to said first portion of said second column line, said second terminal connected to said second portion of said second column line, and said gate terminal responsive to said switch control signal.

14. A circuit connected to a data line, comprising:

a first column line connected to the data line, said first column line having a first portion and a second portion;

a second column line connected to the data line, said second column line having a first portion and a second portion;

a dynamic memory cell connected to said first column line;

a control circuit having an output terminal;

an amplifier having a first terminal and a second terminal, said first terminal connected to said first column line and said second terminal connected to said second column line;

a first switch having a first terminal, a second terminal, and a gate terminal, said first terminal connected to said first portion of said first column line, said second terminal connected to said second portion of said first column line, and said gate terminal connected to said output terminal of said control circuit so that said first switch isolates said amplifier from said cell while said amplifier is connected to and receives data from the data line and said first switch connects said amplifier to said cell when said amplifier is disconnected from the data line; and a second switch having a first terminal, a second terminal, and a gate terminal, said first terminal connected to said first portion of said second column line, said second terminal connected to said second portion of said second column line, and said gate terminal connected to said output terminal of said control circuit.

15. A circuit connected to a data line, comprising:

a column line connected to the data line, said column line having a first portion, a second portion, and a third portion;

a dynamic memory cell connected to said column line;

an amplifier connected to said column line;

a first switch having a first terminal, a second terminal, and a gate terminal, said first terminal connected to said first portion of said column line, said second terminal connected to said second portion of said column line, and said gate terminal responsive to a first switch control signal so that said first switch isolates said amplifier from said cell while said amplifier is connected to and receives data from the data line and then connects said amplifier to said cell to thereby begin to write data to said cell; and a second switch having a first terminal, a second terminal, and a gate terminal, said first terminal connected to said second portion of said column line, said second terminal connected to said third portion of said column line, and said gate terminal responsive to a second switch control signal so that said second switch disconnects said amplifier from the data line before said data is completely written to said cell.

16. A circuit connected to a data line, comprising:

a column line connected to the data line, said column line having a first portion, a second portion, and a third portion;

a dynamic memory cell connected to said column line;

a control circuit having a first output terminal and a second output terminal;

an amplifier connected to said column line;

a first switch having a first terminal, a second terminal, and a gate terminal, said first terminal connected to said first portion of said column line, said second terminal connected to said second portion of said column line, and said gate terminal connected to said first output terminal of said control circuit so that said first switch isolates said amplifier from said cell while said amplifier is connected to and receives data from the data line and then connects said amplifier to said cell to thereby begin to write data to said cell; and a second switch having a first terminal, a second terminal, and a gate terminal, said first terminal connected to said second portion of said column line, said second terminal connected to said third portion of said column line, and said gate terminal connected to said second output terminal of said control circuit so that said second switch disconnects said amplifier from the data line before said data is completely written to said cell.

17. A circuit connected to a data line, comprising:

a first column line connected to the data line, said first column line having a first portion, a second portion, and a third portion;

a second column line connected to the data line, said second column line having a first portion, a second portion, and a third portion;

a dynamic memory cell connected to said first column line;

an amplifier having a first terminal and a second terminal, said first terminal connected to said first column line and said second terminal connected to said second column line;

a first switch having a first terminal, a second terminal, and a gate terminal, said first terminal connected to said first portion of said first column line, said second terminal connected to said second portion of said first column line, and said gate terminal responsive to a first switch control signal so that said first switch isolates said amplifier from said cell while said amplifier is connected to and receives data from the data line and then connects said amplifier to said cell to thereby begin to write data to said cell;

a second switch having a first terminal, a second terminal, and a gate terminal, said first terminal connected to said second portion of said first column line, said second terminal connected to said third portion of said first column line, and said gate terminal responsive to a second switch control signal so that said second switch disconnects said amplifier from the data line before said data is completely written to said cell;

a third switch having a first terminal, a second terminal, and a gate terminal, said first terminal connected to said first portion of said second column line, said second terminal connected to said second portion of said second column line, and said gate terminal responsive to said first switch control signal; and a fourth switch having a first terminal, a second terminal, and a gate terminal, said first terminal connected to said second portion of said second column line, said second terminal connected to said third portion of said second column line, and said gate terminal responsive to said second switch control signal.

18. A circuit connected to a data line, comprising:

a first column line connected to the data line, said first column line having a first portion, a second portion, and a third portion;

a second column line connected to the data line, said second column line having a first portion, a second portion, and a third portion;

a dynamic memory cell connected to said first column line;

a control circuit having a first output terminal and a second output terminal;

an amplifier having a first terminal and a second terminal, said first terminal connected to said first column line and said second terminal connected to said second column line;

a first switch having a first terminal, a second terminal, and a gate terminal, said first terminal connected to said first portion of said first column line, said second terminal connected to said second portion of said first column line, and said gate terminal connected to said first output terminal of said control circuit so that said first switch isolates said amplifier from said cell while said amplifier is connected to and receives data from the data line and then connects said amplifier to said cell to thereby begin to write data to said cell;

a second switch having a first terminal, a second terminal, and a gate terminal, said first terminal connected to said second portion of said first column line, said second terminal connected to said third portion of said first column line, and said gate terminal connected to said second output terminal of said control circuit so that said second switch disconnects said amplifier from the data line before said data is completely written to said cell;

a third switch having a first terminal, a second terminal, and a gate terminal, said first terminal connected to said first portion of said second column line, said second terminal connected to said second portion of said second column line, and said gate terminal connected to said first output terminal of said control circuit; and a fourth switch having a first terminal, a second terminal, and a gate terminal, said first terminal connected to said second portion of said second column line, said second terminal connected to said third portion of said second column line, and said gate terminal connected to said second output terminal of said control circuit.

19. A system, comprising:

a processor; and a dynamic memory device responsive to said processor, said memory device including a circuit connected to a data line, said circuit including:

a column line connected to the data line, said column line having a first portion and a second portion;

a dynamic memory cell connected to said column line;

an amplifier connected to said column line; and a switch having a first terminal, a second terminal, and a gate terminal, said first terminal connected to said first portion of said column line, said second terminal connected to said second portion of said column line, and said gate terminal responsive to a switch control signal so that said switch isolates said amplifier from said cell while said amplifier is connected to and receives data from the data line and said first switch connects said amplifier to said cell when said amplifier is disconnected from the data line.

20. A method of writing data to a dynamic memory cell, comprising:

isolating a column line from an amplifier while said amplifier is connected to a data line;

connecting said amplifier to the cell; and disconnecting said amplifier from said data line before connecting said amplifier to the cell.

21. A method of writing data to a dynamic memory cell, comprising:

isolating the cell from an amplifier while said amplifier is connected to and receives data from a data line;

disconnecting said amplifier from said data line; and connecting said amplifier to the cell to thereby write data to the cell.

22. A method of writing data to a dynamic memory cell, comprising:

isolating the cell from an amplifier while said amplifier is connected to and receives data from a data line;

connecting said amplifier to the cell to thereby begin to write data to the cell; and disconnecting said amplifier from said data line before said data is completely written to the cell.

* * * * *